US012740461B2

(12) United States Patent
Pan et al.

(10) Patent No.: US 12,740,461 B2
(45) Date of Patent: Sep. 15, 2026

(54) CHIP PACKAGING METHOD AND CHIP PACKAGING STRUCTURE

(71) Applicant: WUHAN XINXIN SEMICONDUCTOR MANUFACTURING CO., LTD., Wuhan (CN)

(72) Inventors: Zhigang Pan, Wuhan (CN); Ning Wang, Wuhan (CN); Xiaoqin Sun, Wuhan (CN); Peng Sun, Wuhan (CN); Daohong Yang, Wuhan (CN); Sheng Hu, Wuhan (CN); Guoliang Ye, Wuhan (CN)

(73) Assignee: WUHAN XINXIN SEMICONDUCTOR MANUFACTURING CO., LTD., Wuhan (CN)

( * ) Notice: Subject to any disclaimer, the term of this patent is extended or adjusted under 35 U.S.C. 154(b) by 685 days.

(21) Appl. No.: 18/149,077

(22) Filed: Dec. 31, 2022

(65) Prior Publication Data

US 2024/0105532 A1 Mar. 28, 2024

Related U.S. Application Data

(63) Continuation of application No. PCT/CN2022/144360, filed on Dec. 30, 2022.

(30) Foreign Application Priority Data

Sep. 28, 2022 (CN) ......................... 202211193941.2

(51) Int. Cl.

*H10W 70/692* (2026.01)
*H10W 20/20* (2026.01)
(Continued)

(52) U.S. Cl.

CPC ......... *H10W 70/692* (2026.01); *H10W 20/20* (2026.01); *H10W 90/00* (2026.01);
(Continued)

(58) Field of Classification Search

CPC ....... H01L 21/4807; H01L 2224/16227; H01L 2224/73203; H01L 2224/80895;
(Continued)

(56) References Cited

U.S. PATENT DOCUMENTS 11,462,495 B2 * 10/2022 Yu ........................... H01L 24/05
11,798,909 B2 * 10/2023 Hsu ......................... H01L 24/19
(Continued)

FOREIGN PATENT DOCUMENTS

CN 110137096 A 8/2019
CN 110364445 A 10/2019
(Continued)

OTHER PUBLICATIONS

International Search Report, International Application No. PCT/CN2022/144360, mailed May 11, 2023 (6 pages).
(Continued)

*Primary Examiner* — Telly D Green

(57) ABSTRACT

The present disclosure provides a chip packaging method and a chip packaging structure. The chip packaging method includes: providing an encapsulated grain and a packaging substrate, the encapsulated grain including a first hybrid bonding structure; wherein the packaging substrate includes a front side and a back side opposite to each other; a second hybrid bonding structure is formed on the front side of the packaging substrate and a connection pin is formed on the back side of the packing substrate; the second hybrid bonding structure and the connection pin are electrically connected through a third connecting metal column penetrating the packaging substrate; and bonding together the first
(Continued)

hybrid bonding structure of the encapsulated grain and the second hybrid bonding structure of the packaging substrate by medium-to-medium and metal-to-metal aligned bonding such that the encapsulated grain is bonded to the packaging substrate.

17 Claims, 3 Drawing Sheets

(51) Int. Cl.

| | |
|---|---|
| ***H10W 72/00*** | (2026.01) |
| ***H10W 90/00*** | (2026.01) |
| ***H10W 90/20*** | (2026.01) |
| ***H10W 99/00*** | (2026.01) |

(52) U.S. Cl.
CPC .......... *H10W 99/00* (2026.01); *H10W 72/856* (2026.01); *H10W 90/297* (2026.01); *H10W 90/724* (2026.01)

(58) Field of Classification Search
CPC . H01L 2224/80896; H01L 2225/06517; H01L 2225/06541; H01L 2225/06544; H01L 23/15; H01L 23/3128; H01L 23/481; H01L 23/49816; H01L 23/5384; H01L 24/08; H01L 24/16; H01L 24/73; H01L 24/80; H01L 25/0652; H01L 25/50
See application file for complete search history.

(56) References Cited

U.S. PATENT DOCUMENTS

| | | | | |
|---|---|---|---|---|
| 2009/0020864 | A1 | 1/2009 | Pu et al. | |
| 2015/0371932 | A1 | 12/2015 | Hu | |
| 2020/0176384 | A1 * | 6/2020 | Wu | H01L 25/0655 |
| 2020/0185330 | A1 * | 6/2020 | Yu | H01L 24/24 |
| 2021/0134724 | A1 * | 5/2021 | Rubin | H01L 23/5385 |
| 2021/0366854 | A1 | 11/2021 | Yu et al. | |
| 2022/0045025 | A1 * | 2/2022 | Hsu | H01L 24/19 |
| 2022/0093517 | A1 * | 3/2022 | Aleksov | H01L 23/5385 |

FOREIGN PATENT DOCUMENTS

| | | | |
|---|---|---|---|
| WO | 2021092779 | A1 | 5/2021 |
| WO | 2022087894 | A1 | 5/2022 |
| WO | 2022143930 | A1 | 7/2022 |
| WO | 2022161464 | A1 | 8/2022 |

OTHER PUBLICATIONS

Chinese First Office Action, Chinese Application No. 202211193941.2, mailed Dec. 30, 2025 (20 pages).

* cited by examiner

CHIP PACKAGING METHOD AND CHIP PACKAGING STRUCTURE

CROSS REFERENCE

The present application is a continuation application of PCT application No. PCT/CN2022/144360 filed on Dec. 30, 2022, which claims priority of Chinese Patent Application No. 202211193941.2, filed on Sep. 28, 2022. The entire contents of the above-identified applications are hereby incorporated by reference in its entirety.

TECHNICAL FIELD

The present disclosure relates to the field of semiconductor technologies, and in particular to a chip packaging method and a chip packaging structure.

BACKGROUND

Packaging substrate (SUB), also known as an integrated circuit (IC) carrier board and an IC packaging substrate, is a product between a chip and a printed circuit board (PCB). As a bridge between the chip and printed circuit board connection, the packaging substrate can be directly applied to carry the chip to provide support and protection for the chip, to establish an effective heat dissipation path, and to provide an electrical connection between the chip and the printed circuit board.

The connection method between the packaging substrate and the chip includes wire bonding (WB) and flip chip (FC). The connection method between the packaging substrate and the printed circuit board includes ball gate array (BGA), chip size package (CSP), land grid array (LGA), and pin grid array (PGA). The current mainstream connection types of the packaging substrate include WB+BGA/CSP, and FC+BGA/LGA/PGA. Connecting the packaging substrate to the chip through the way of WB will waste a lot of area. Connecting the packaging substrate to the chip through the way of FC generally need to grow bumps on the chip through a technology of bump process flow, thereby connecting the chip to the packaging substrate through the bumps. However, both methods result in lower integration of the chip on the packaging substrate and larger product size.

SUMMARY OF THE DISCLOSURE

The present disclosure provides a chip packaging method and a chip packaging structure, aiming to solve the problem of larger product size caused by reduced integration of existing encapsulated grain on the packaging substrate.

To solve the above technical problem, a first aspect adopted by the present disclosure is to provide a chip packaging method, including: providing an encapsulated grain and a packaging substrate, the encapsulated grain including a first hybrid bonding structure; wherein the packaging substrate includes a front side and a back side opposite to each other; a second hybrid bonding structure is formed on the front side of the packaging substrate and a connection pin is formed on the back side of the packing substrate; the second hybrid bonding structure and the connection pin are electrically connected through a metal post penetrating the packaging substrate; and bonding together the first hybrid bonding structure of the encapsulated grain and the second hybrid bonding structure of the packaging substrate by medium-to-medium and metal-to-metal aligned bonding such that the encapsulated grain is bonded to the packaging substrate.

In some embodiments, the packaging substrate is a ceramic substrate.

In some embodiments, the connection pin includes a metal bump and/or a metal solder ball.

In some embodiments, the encapsulated grain includes a wafer and at least one chip; the at least one chip is bonded to the wafer through a hybrid bonding structure, and a side of the wafer away from the at least one chip is formed with the first hybrid bonding structure; a third hybrid bonding structure is formed on a side of the wafer bonded to the at least one chip, and a pitch of the first hybrid bonding structure is greater than a pitch of the third hybrid bonding structure.

To solve the above technical problem, a second aspect adopted by the present disclosure is to provide a chip packaging structure, including: an encapsulated grain, including a first hybrid bonding structure; and a packaging substrate, including a front side and a back side opposite to each other; a second hybrid bonding structure is formed on the front side of the packaging substrate and a connection pin is formed on the back side of the packing substrate; the second hybrid bonding structure and the connection pin are electrically connected through a metal post penetrating the packaging substrate; wherein the first hybrid bonding structure of the encapsulated grain is bonded to the second hybrid bonding structure of the packaging substrate by medium-to-medium and metal-to-metal aligned bonding such that the encapsulated grain is bonded to the packaging substrate.

In some embodiments, the packaging substrate is a ceramic substrate.

In some embodiments, the connection pin includes a metal bump and/or a metal solder ball.

In some embodiments, the encapsulated grain includes a wafer and at least one chip; the at least one chip is bonded to the wafer through a hybrid bonding structure, and a side of the wafer away from the at least one chip is formed with the first hybrid bonding structure; a third hybrid bonding structure is formed on a side of the wafer bonded to the at least one chip, and a pitch of the first hybrid bonding structure is greater than a pitch of the third hybrid bonding structure.

In some embodiments, the encapsulated grain further includes an encapsulated layer, covering the at least one chip and a gap between adjacent two of the at least one chip.

In some embodiments, the chip packaging structure further includes a printed circuit board; wherein the connecting pin of the packaging substrate is bonded to a metal bump and/or a metal solder ball of the printed circuit board.

Technical effect of the present disclosure: compared to the related art, the embodiments provide a chip packaging method and a chip packaging structure by providing an encapsulated grain and a packaging substrate, the encapsulated grain including a first hybrid bonding structure. The packaging substrate includes a front side and a back side opposite to each other. The packaging substrate is formed with a second hybrid bonding structure on the front side and with a connection pin on the back side. The second hybrid bonding structure and the connection pin are electrically connected through a metal post penetrating the packaging substrate. The first hybrid bonding structure of the encapsulated grain is bonded to the second hybrid bonding structure of the packaging substrate by medium-to-medium and metal-to-metal aligned bonding such that the encapsulated grain is bonded to the packaging substrate, which eliminates the need for a bump process flow compared to a solution in which the packaging substrate is connected to the packaging substrate by means of wire bonding or flip chip. In addition, since the encapsulated grain is directly laminated to the packaging substrate, there is no need to reserve space for setting bumps between the two, thereby enabling the encapsulated grain to be highly integrated on the packaging substrate, reducing the size of the chip packaging structure, and lowering the cost.

BRIEF DESCRIPTION OF THE DRAWINGS

In order to more clearly illustrate the technical solutions in the embodiments of the present disclosure, the following is a brief description of the drawings required for the description of the embodiments, and it will be obvious that the drawings in the following description are only some embodiments of the present disclosure, and that other drawings can be obtained from these drawings without creative work for those skilled in the art.

REFERENCE NUMERALS

Figure 1:
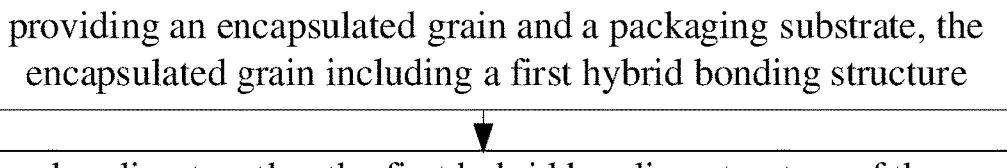
FIG. 1 is a flowchart of a chip packaging method according to an embodiment of the present disclosure.

Encapsulated grain 1, wafer 11, first semiconductor substrate 111, first dielectric layer 112; first connecting metal column 113, first interconnection structure 114, second dielectric layer 115, first hybrid bonding structure 116, third hybrid bonding structure 117, chip 12, second semiconductor substrate 121, third dielectric layer 122, second interconnection structure 123, fourth hybrid bonding structure 124, encapsulated layer 13, pin surface A, packaging substrate 2, third substrate 21, third connecting metal column 211, fourth dielectric layer 22, substrate surface B, second hybrid bonding structure 23, connection pin 24, fifth dielectric layer 25, and metal connection block 251.

DETAILED DESCRIPTION

The technical solutions in embodiments of the present disclosure will be clearly and completely described below in conjunction with the accompanying drawings in the embodiments of the present disclosure, and it is obvious that the described embodiments are only a part of the embodiments of the present disclosure, but not all of them. Based on the embodiments in the present disclosure, all other embodiments obtained by those skilled in the art without creative labor fall within the scope of the present disclosure.

The terms “first”, “second”, and “third” in the present disclosure are intended for descriptive purposes only and are not to be construed as indicating or implying relative importance or implicitly indicating the number of indicated technical features. Therefore, a feature defined with “first”, “second”, or “third” may explicitly or implicitly include at least one such feature. In the description of the present disclosure, “plurality” means at least two, e.g., two, three, etc., unless otherwise expressly and specifically limited. All directional indications (e.g., up, down, left, right, forward, backward) in the present disclosure are intended only to explain the relative position relationship, movement, etc., between components in a particular posture (as shown in the accompanying drawings), and if that particular posture is changed, the directional indications are changed accordingly. In addition, the terms “include” and “have”, and any variations thereof are intended to cover non-exclusive inclusion. For example, a process, method, system, product, or apparatus including a series of steps or units is not limited to the listed steps or units, but optionally further includes steps or units not listed, or optionally further includes other steps or units inherent to the process, method, product, or apparatus.

References herein to “embodiment” mean that particular features, structures, or characteristics described in connection with an embodiment may be included in at least one embodiment of the present disclosure. The presence of the phrase at various positions in the specification does not necessarily mean the same embodiment, nor is it a separate or alternative embodiment that is mutually exclusive with other embodiments. It is understood, both explicitly and implicitly, by those skilled in the art that the embodiments described herein may be combined with other embodiments.

The present disclosure is described in detail below in connection with the accompanying drawings and embodiments. Referring to FIG. 1, FIG. 1 is a flowchart of a chip packaging method according to an embodiment of the present disclosure. In the embodiments, a chip packaging method is provided, including the following steps.

Step S1: providing an encapsulated grain and a packaging substrate, the encapsulated grain including a first hybrid bonding structure.

Figure 2:
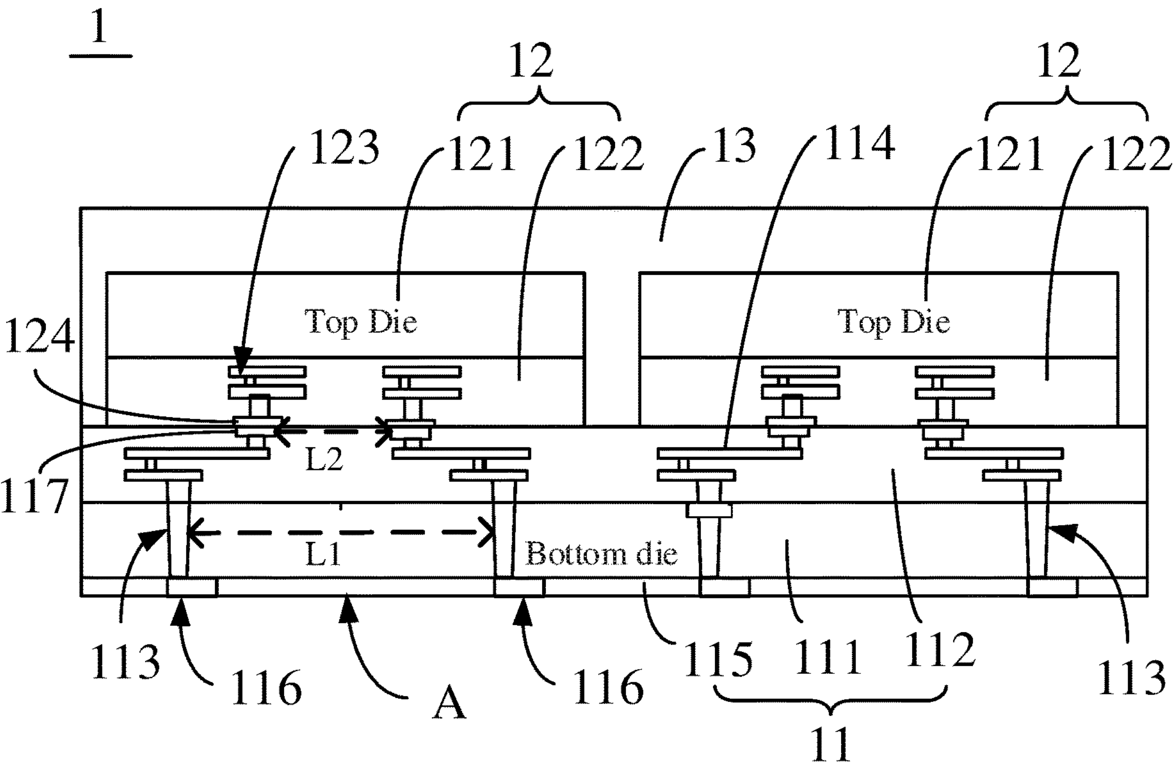
FIG. 2 is a structural schematic view of an encapsulated grain according to an embodiment of the present disclosure.

Referring to FIG. 2, FIG. 2 is a structural schematic view of an encapsulated grain according to an embodiment of the present disclosure. The encapsulated grain 1 includes a wafer 11, at least one chip 12, and an encapsulated layer 13. The at least one chip 12 is bonded to the wafer 11, and a side of the wafer 11 away from the at least one chip 12 is taken as a pin surface A. The wafer 11 is formed with a first hybrid bonding structure 116. Multiple chips may be arranged in an array on the wafer 11.

A third hybrid bonding structure 117 is formed on a side of wafer 11 bonded to at least one chip 12, and a pitch L1 of the first hybrid bonding structures 116 is greater than a pitch L2 of the third hybrid bonding structures 117, which enables more chips 12 to be bonded on the wafer 11, thereby increasing the utilization of the surface area of the wafer 11 and reducing the product size.

The wafer 11 may include a first semiconductor substrate 111, and a first dielectric layer 112 and a second dielectric layer 115 laminated on opposite sides of the first semiconductor substrate 111. A side surface of the second dielectric layer 115 away from the first semiconductor substrate 111 is taken as the pin surface A. At least one electronic device and at least one first connecting metal column 113 are formed in the first semiconductor substrate 111, and each of the at least one first connecting metal column 113 extends to a side surface of the first semiconductor substrate 111 away from the first dielectric layer 112. The first hybrid bonding structure 116 is formed in the second dielectric layer 115, electrically connected to the first connecting metal column 113, and exposed from the pin surface A.

A first interconnection structure 114 is formed in the first dielectric layer 112. The first interconnection structure 114 is electrically connected to the first connecting metal column 113 in one-to-one correspondence. The third hybrid bonding structure 117 is formed on a side surface of the first dielectric layer 112 away from the first semiconductor substrate 111 and is electrically connected to the first interconnection structure 114.

Referring to FIG. 2, each chip 12 includes a second semiconductor substrate 121 and a third dielectric layer 122. At least one electronic device is formed in the second semiconductor substrate 121, the third dielectric layer 122 disposed closely adhering to the first dielectric layer 112 is laminated on the second semiconductor substrate 121, and a second interconnection structure 123 and a fourth hybrid bonding structure 124 electrically connected to the second interconnection structure 123 are formed in the third dielectric layer 122. The fourth hybrid bonding structure 124 is formed on a side surface of the third dielectric layer 122 away from the second semiconductor substrate 121. The fourth hybrid bonding structure 124 is bonded to the third hybrid bonding structure 117 for aligning and bonding the first dielectric layer 112 to the third dielectric layer 122, and aligning and bonding the third hybrid bonding structure 117 to the fourth hybrid bonding structure 124, to enable the chip 12 to be bonded to the wafer 11. It is understood that the second interconnection structure 123 is electrically connected to the first interconnection structure 114 of the wafer 11 specifically by the fourth hybrid bonding structure 124.

It should be noted that the hybrid bonding involved in the present disclosure is to inlay metal contacts between dielectric materials and simultaneously apply heat treatment to join the two materials, using the atomic diffusion of metals in the solid state to achieve bonding. The hybrid bonding can achieve pitch miniaturization to less than 1 micron.

In some embodiments, the first dielectric layer 112, the second dielectric layer 115, and/or the third dielectric layer 122 may specifically include insulating materials such as silicon dioxide, silicon nitride, aluminum oxide, etc.

The encapsulated layer 13 is arranged on a side surface of the wafer 11 facing the chip 12. The encapsulated layer 13 is filled in a gap between adjacent chips 12 and further covers the chip 12 to protect the chips 12. The encapsulated layer 13 may be a semi-cured sheet, or an ethyl silicate dielectric material, or a silica dielectric adhesive.

Figure 3:
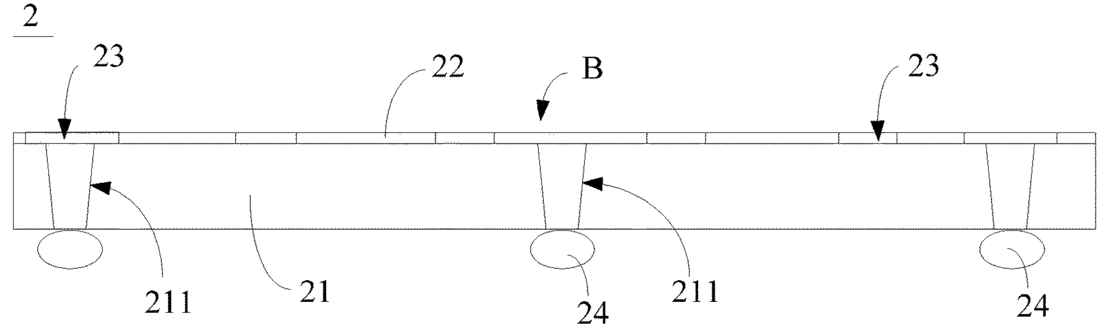
FIG. 3 is a structural schematic view of a packaging substrate according to an embodiment of the present disclosure.

Referring to FIG. 3, FIG. 3 is a structural schematic view of a packaging substrate according to an embodiment of the present disclosure. The packaging substrate 2 includes a front side and a back side opposite to each other. A second hybrid bonding structure 23 is formed on the front side of the packaging substrate 2 and a connection pin 24 is formed on the back side of the packing substrate 2. The second hybrid bonding structure 23 and the connection pin 24 are electrically connected through a third connecting metal column 211 penetrating the packaging substrate 2.

Depending on the substrate, the packaging substrate may be divided into rigid materials, e.g., BT carrier board, ABF carrier board, MIS carrier board; flexible materials, e.g., PI, PE; and inorganic materials, e.g., ceramics (alumina, aluminum nitride, silicon carbide, etc.). The packaging substrate in the present disclosure may be a ceramic substrate. The ceramic material itself has properties such as high thermal conductivity, good heat resistance, high insulation, high strength, and thermal matching with the chip material, which is well suited as a power device packaging substrate.

Specifically, as shown in FIG. 3, the packaging substrate 2 includes a third substrate 21 and a fourth dielectric layer 22 that are laminated.

The third substrate 21 includes a first side and a second side opposite to each other. The second hybrid bonding structure 23 is disposed on the first side of the third substrate 21, the connection pin 24 is formed on the second side of the third substrate 21, and the third connecting metal column 211 runs through the first side and second side of the third substrate 21. In some embodiments, one of the third connecting metal columns 211 is correspondingly connected to one of the connection pins 24. The connection pin 24 may include a metal bump and/or a metal solder ball.

The fourth dielectric layer 22 is laminated to the first side of the third substrate 21 and a side of the fourth dielectric layer 22 away from the third substrate 21 is taken as a substrate surface B. The second hybrid bonding structure 23 is formed in the fourth dielectric layer 22 and is exposed from the substrate surface B of the fourth dielectric layer 22.

Figure 4:
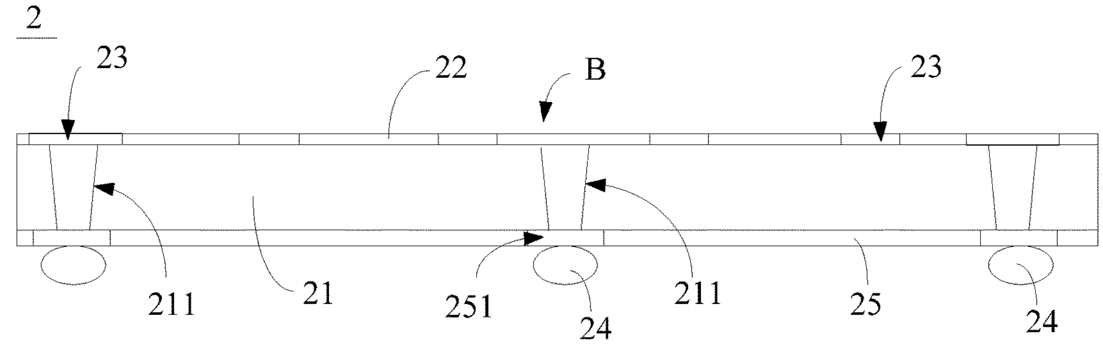
FIG. 4 is a structural schematic view of a packaging substrate according to another embodiment of the present disclosure.

Of course, in other embodiments, referring to FIG. 4, FIG. 4 is a structural schematic view of a packaging substrate according to another embodiment of the present disclosure. Different from the packaging substrate 2 in FIG. 3, the packaging substrate 2 may further include a fifth dielectric layer 25, which is laminated on the second side of the third substrate 21, i.e., arranged on a side surface of the third substrate 21 away from the fourth dielectric layer 22. A metal connection block 251 is formed in the fifth dielectric layer 25, and the metal connection block 251 is arranged with the third connecting metal column 211 in one-to-one correspondence and is electrically connected to the corresponding third connecting metal column 211. In the embodiments, the connection pin 24 is specifically connected to a side surface of the metal connection block 251 away from the third connecting metal column 211, to be indirectly electrically connected to the third connecting metal column 211 through the metal connection block 251.

Step S2: bonding together the first hybrid bonding structure of the encapsulated grain and the second hybrid bonding structure of the packaging substrate by medium-to-medium and metal-to-metal aligned bonding such that the encapsulated grain is bonded to the packaging substrate.

Figure 5:
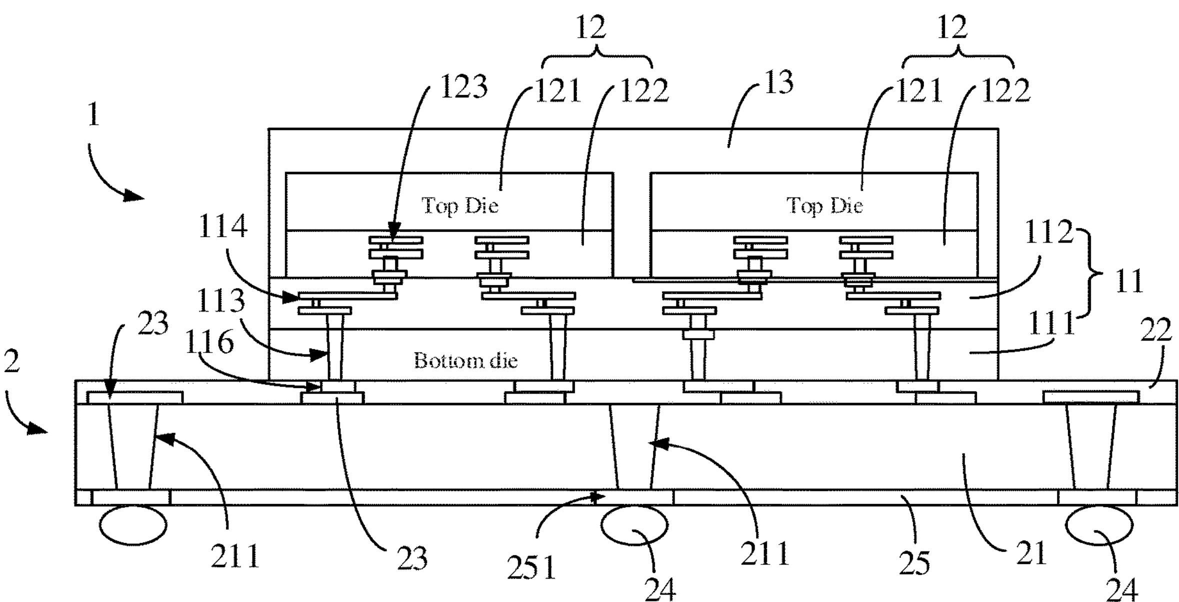
FIG. 5 is a structural schematic view of a package chip according to an embodiment of the present disclosure.
Figure 6:
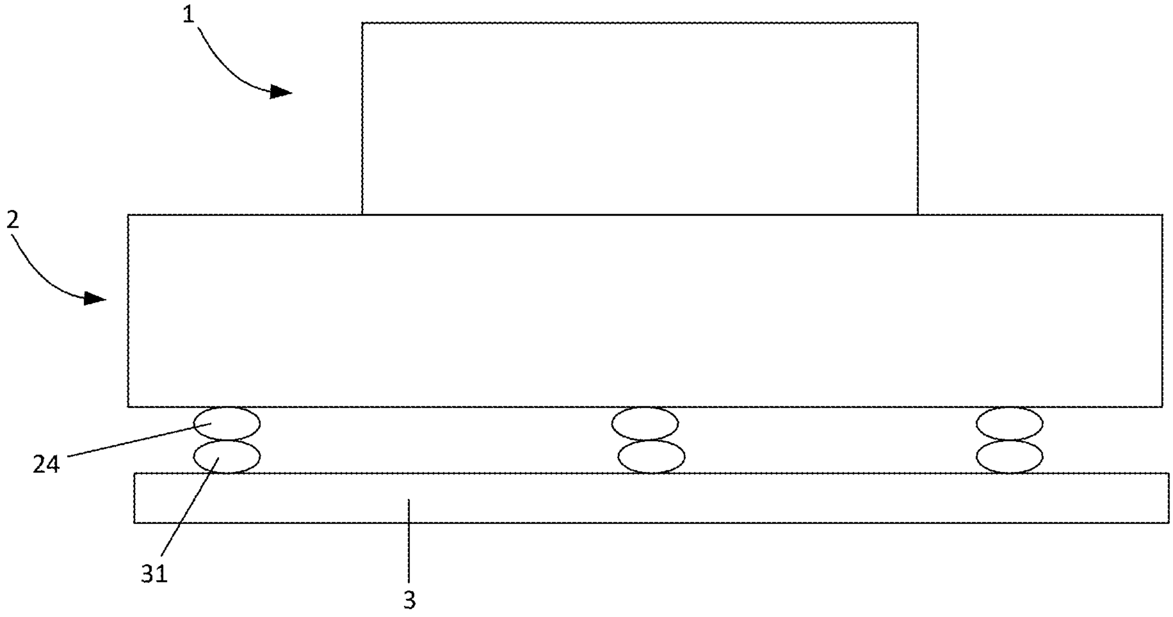
FIG. 6 is a structural schematic view of the chip packaging structure in which the packaging substrate is connected to a printed circuit board, according to an embodiment of the present disclosure.

The specific structure of the package chip processed in step S2 can be seen in FIG. 5, which is a structural schematic view of a package chip according to an embodiment of the present disclosure. In a specific implementation, the second dielectric layer 115 of the encapsulated grain 1 is aligned and bonded to the fourth dielectric layer 22 of the packaging substrate 2, and the first hybrid bonding structure 116 of the encapsulated grain 1 is in aligned contact with the second hybrid bonding structure 23 of the packaging substrate 2 exposed from the substrate surface B. Subsequently, an annealing process is performed to cause the first hybrid bonding structure 116 and the second hybrid bonding structure 23 to expand and bond together for aligning and bonding the second dielectric layer 115 to the fourth dielectric layer 22, such that the encapsulated grain 1 is bonded to the packaging substrate 2.

The annealing process is at a temperature of 550 to 650° C.

The embodiments provide a chip packaging method by providing an encapsulated grain 1 and a packaging substrate 2, the encapsulated grain 1 including a first hybrid bonding structure 116. The packaging substrate 2 includes a front side and a back side opposite to each other. A second hybrid bonding structure 23 is formed on the front side of the packaging substrate 2 and a connection pin 24 is formed on the back side of the packing substrate 2. The second hybrid bonding structure 23 and the connection pin 24 are electrically connected through a third connecting metal column 211 penetrating the packaging substrate 2. The first hybrid bonding structure 116 of the encapsulated grain 1 is bonded together to the second hybrid bonding structure 23 of the packaging substrate 2 by medium-to-medium and metal-to-metal aligned bonding such that the encapsulated grain 1 is bonded to the packaging substrate 2, which eliminates the need for a bump process flow compared to a solution in which the encapsulated grain 1 is connected to the packaging substrate 2 using a bump. In addition, since the encapsulated grain 1 is directly laminated to the packaging substrate 2, there is no need to reserve space for setting bumps between the two, thereby enabling the encapsulated grain 1 to be highly integrated on the packaging substrate 2, reducing the size of the package chip, and lowering the cost. Moreover, by setting the pitch L1 of the first hybrid bonding structures 116 greater than the pitch L2 of the third hybrid bonding structures 117, more chips 12 may be bonded on the wafer 11, thereby increasing the utilization of the surface area of the wafer 11 and reducing the product size.

In some embodiments, referring to FIG. 5, a chip packaging structure is further provided that can be made by the chip packaging method provided in the above embodiments. The package chip specifically includes an encapsulated grain 1 and a packaging substrate 2.

The encapsulated grain 1 includes a wafer 11, at least one chip 12, and an encapsulated layer 13. The at least one chip 12 is bonded to the wafer 11, and a side of the wafer 11 away from the at least one chip 12 is taken as a pin surface A. A first hybrid bonding structure 116 is formed on the wafer 11. It is understood by those skilled in the art that the multiple chips 12 may be arranged in an array on the wafer 11. A third hybrid bonding structure 117 is formed on a side of the wafer 11 bonded to the at least one chip 12, and a pitch L1 of the first hybrid bonding structures 116 is greater than a pitch L2 of the third hybrid bonding structures 117, which enables more chips 12 to be bonded on the wafer 11, thereby increasing the utilization of the surface area of the wafer 11 and reducing the product size. It can be understood that the above pitches L1 and L2 may be construed as: for each of the at least one chip 12, the first hybrid bonding structure 116 includes two first hybrid bonding structures 116 and the third hybrid bonding structure 117 includes two third hybrid bonding structures 117, and an orthographic projection of each of the two first hybrid bonding structures 116 and the two third hybrid bonding structures 117 on the packaging substrate 2 is within an orthographic projection of the chip 12 on the packaging substrate 2. The pitch L1 of the two first hybrid bonding structures 116 is greater than the pitch L2 of the two third hybrid bonding structures 117.

The wafer 11 may include a first semiconductor substrate 111, and a first dielectric layer 112 and a second dielectric layer 115 laminated on opposite sides of the first semiconductor substrate 111. A side surface of the second dielectric layer 115 away from the first semiconductor substrate 111 is taken as the pin surface A. At least one electronic device and at least one first connecting metal column 113 are formed in the first semiconductor substrate 111, and each of the at least one first connecting metal column 113 extends to a side surface of the first semiconductor substrate 111 away from the first dielectric layer 112. The first hybrid bonding structure 116 is formed in the second dielectric layer 115, electrically connected to the first connecting metal column 113, and exposed from the pin surface A.

A first interconnection structure 114 is formed in the first dielectric layer 112. The first interconnection structure 114 is electrically connected to the first connecting metal column 113 in one-to-one correspondence. The third hybrid bonding structure 117 is formed on a side surface of the first dielectric layer 112 away from the first semiconductor substrate 111 and is electrically connected to the first interconnection structure 114.

Referring to FIG. 2, each chip 12 includes a second semiconductor substrate 121 and a third dielectric layer 122. At least one electronic device is formed in the second semiconductor substrate 121, the third dielectric layer 122 disposed closely adhering to the first dielectric layer 112 is laminated on the second semiconductor substrate 121, and a second interconnection structure 123 and a fourth hybrid bonding structure 124 electrically connected to the second interconnection structure 123 are formed in the third dielectric layer 122. The fourth hybrid bonding structure 124 is formed on a side surface of the third dielectric layer 122 away from the second semiconductor substrate 121. The fourth hybrid bonding structure 124 is bonded to the third hybrid bonding structure 117 for aligning and bonding the first dielectric layer 112 to the third dielectric layer 122, and aligning and bonding the third hybrid bonding structure 117 to the fourth hybrid bonding structure 124, to enable the chip 12 to be bonded to the wafer 11. It is understood that the second interconnection structure 123 is electrically connected to the first interconnection structure 114 of the wafer 11 specifically by the fourth hybrid bonding structure 124.

In some embodiments, the first dielectric layer 112, the second dielectric layer 115, and/or the third dielectric layer 122 may specifically include insulating materials such as silicon dioxide, silicon nitride, aluminum oxide, etc.

The encapsulated layer 13 is arranged on a side surface of the wafer 11 facing the chip 12. The encapsulated layer 13 is filled in a gap between adjacent chips 12 and further covers the chip 12 to protect the chips 12. The encapsulated layer 13 may be a semi-cured sheet, or an ethyl silicate dielectric material, or a silica dielectric adhesive.

The packaging substrate 2 includes a front side and a back side opposite to each other. A second hybrid bonding structure 23 is formed on the front side of the packaging substrate 2 and a connection pin 24 is formed on the back side of the packing substrate 2. The second hybrid bonding structure 23 and the connection pin 24 are electrically connected through a third connecting metal column 211 penetrating the packaging substrate 2.

The packaging substrate 2 includes a third substrate 21 and a fourth dielectric layer 22 that are laminated.

The third substrate 21 includes a first side and a second side opposite to each other. The second hybrid bonding structure 23 is disposed on the first side of the third substrate 21, the connection pin 24 is formed on the second side of the third substrate 21, and the third connecting metal column 211 runs through the first side and second side of the third substrate 21. In some embodiments, one of the third connecting metal columns 211 is correspondingly connected to one of the connection pins 24. The connection pin 24 may include a metal bump and/or a metal solder ball.

The fourth dielectric layer 22 is laminated to the first side of the third substrate 21 and a side of the fourth dielectric layer 22 away from the third substrate 21 is taken as a substrate surface B. In some embodiments, at least one first hybrid bonding structure 116 is arranged in the fourth dielectric layer 22, and one of the at least one first hybrid bonding structure 116 is connected to the second hybrid bonding structure 23 in one-to-one correspondence and exposed from the substrate surface B of the fourth dielectric layer 22.

In some embodiments, an annealing process is performed to cause the first hybrid bonding structure 116 and the second hybrid bonding structure 23 to expand and bond together, thereby packaging the encapsulated grain 1 on the packaging substrate 2. The annealing process is at a temperature of 550 to 650° C. The first connecting metal column 113, the first hybrid bonding structure 116, and the third connecting metal column 211 may include a metallic copper post or a silver post with a silver-plated surface.

Of course, in other embodiments, the packaging substrate 2 may further include a fifth dielectric layer 25, which is laminated on the second side of the third substrate 21. A metal connection block 251 is formed in the fifth dielectric layer 25, and the metal connection block 251 is arranged with the third connecting metal column 211 in one-to-one correspondence and is electrically connected to the corresponding third connecting metal column 211. In the embodiments, the connection pin 24 is specifically connected to a side surface of the metal connection block 251 away from the third connecting metal column 211, to be indirectly electrically connected to the third connecting metal column 211 through the metal connection block 251.

Specifically, the chip packaging structure further includes a PCB 3, and the connecting pin 24 of the packaging substrate 2 is bonded to a metal bump and/or a metal solder ball 31 of the PCB board 3 to achieve an electrical connection between the chip 12 and the printed circuit board 3.

The embodiments provide a chip packaging structure, including an encapsulated grain 1 and a packaging substrate 2, the encapsulated grain 1 including a first hybrid bonding structure 116. The packaging substrate 2 includes a front side and a back side opposite to each other. A second hybrid bonding structure 23 is formed on the front side of the packaging substrate 2 and a connection pin 24 is formed on the back side of the packing substrate 2. The second hybrid bonding structure 23 and the connection pin 24 are electrically connected through a third connecting metal column 211 penetrating the packaging substrate 2. The first hybrid bonding structure 116 of the encapsulated grain 1 is bonded together to the second hybrid bonding structure 23 of the packaging substrate 2 by medium-to-medium and metal-to-metal aligned bonding such that the encapsulated grain 1 is bonded to the packaging substrate 2, thereby enabling the encapsulated grain 1 to be highly integrated on the packaging substrate 2, reducing the size of the package chip, and lowering the cost. Moreover, by setting the pitch L1 of the first hybrid bonding structures 116 greater than the pitch L2 of the third hybrid bonding structures 117, more chips 12 may be bonded on the wafer 11, thereby increasing the utilization of the surface area of the wafer 11 and reducing the product size.

The above is only an implementation of the present disclosure, not to limit the scope of the present disclosure. Any equivalent structure or equivalent process transformation made by using the specification and the attached drawings of the present disclosure, or directly or indirectly applied in other related technical fields, are included in the scope of the present disclosure.

What is claimed is:

1. A chip packaging method, comprising:

providing an encapsulated grain and a packaging substrate, the encapsulated grain comprising a plurality of first hybrid bonding structures, a plurality of third hybrid bonding structures arranged inside the encapsulated grain, and at least one chip; wherein the packaging substrate is a ceramic substrate and comprises a front side and a back side opposite to each other; a plurality of second hybrid bonding structures are formed on the front side of the packaging substrate and a plurality of connection pins are formed on the back side of the packing substrate; the plurality of second hybrid bonding structures are electrically connected to the plurality of connection pins through a plurality of metal posts penetrating the packaging substrate; and bonding together the plurality of first hybrid bonding structures of the encapsulated grain with the plurality of second hybrid bonding structures of the packaging substrate by medium-to-medium and metal-to-metal aligned bonding such that the encapsulated grain is bonded to the packaging substrate;

the encapsulated grain further comprises a wafer; the at least one chip is bonded to the wafer, and a side of the wafer away from the at least one chip is formed with the plurality of first hybrid bonding structures; the plurality of third hybrid bonding structures are formed on a side of the wafer bonded to the at least one chip;

the wafer comprises a first semiconductor substrate, and a first dielectric layer and a second dielectric layer laminated on opposite sides of the first semiconductor substrate; the plurality of first hybrid bonding structures are formed in the second dielectric layer; the plurality of third hybrid bonding structures are formed on a side surface of the first dielectric layer away from the first semiconductor substrate;

the plurality of third hybrid bonding structures are bonded to the at least one chip; and a pitch of any adjacent two of the plurality of first hybrid bonding structures bonding the wafer to the packaging substrate is greater than a pitch of any adjacent two of the plurality of third hybrid bonding structures bonding the wafer to the at least one chip.

2. The chip packaging method according to claim 1, wherein each of the plurality of connection pins comprises a metal bump and/or a metal solder ball.

3. The chip packaging method according to claim 1, wherein each of the at least one chip corresponds to two of the plurality of first hybrid bonding structures and two of the plurality of third hybrid bonding structures, and an orthographic projection of each of the two first hybrid bonding structures and the two third hybrid bonding structures on the packaging substrate is within an orthographic projection of the chip on the packaging substrate.

4. The chip packaging method according to claim 1, further comprising:

performing an annealing process to cause the plurality of first hybrid bonding structures and the plurality of second hybrid bonding structures to expand and bond together; wherein the annealing process is at a temperature of 550° C. to 650° C.

5. A chip packaging structure, comprising:

an encapsulated grain, comprising a plurality of first hybrid bonding structures, a plurality of third hybrid bonding structures arranged inside the encapsulated grain, and at least one chip; and a packaging substrate, being a ceramic substrate and comprising a front side and a back side opposite to each other; a plurality of second hybrid bonding structures are formed on the front side of the packaging substrate and a plurality of connection pins are formed on the back side of the packing substrate; the plurality of second hybrid bonding structures are electrically connected to the plurality of connection pins through a plurality of metal posts penetrating the packaging substrate;

wherein each of the plurality of first hybrid bonding structures of the encapsulated grain is bonded to a respective one of the plurality of second hybrid bonding structures of the packaging substrate by medium-to-medium and metal-to-metal aligned bonding such that the encapsulated grain is bonded to the packaging substrate;

the encapsulated grain further comprises a wafer; the at least one chip is bonded to the wafer, and a side of the wafer away from the at least one chip is formed with the plurality of first hybrid bonding structures; the plurality of third hybrid bonding structures are formed on a side of the wafer bonded to the at least one chip;

the wafer comprises a first semiconductor substrate, and a first dielectric layer and a second dielectric layer laminated on opposite sides of the first semiconductor substrate; the plurality of first hybrid bonding structures are formed in the second dielectric layer; the plurality of third hybrid bonding structures are formed on a side surface of the first dielectric layer away from the first semiconductor substrate;

the plurality of third hybrid bonding structures are bonded to the at least one chip; and a pitch of any adjacent two of the plurality of first hybrid bonding structures bonding the wafer to the packaging substrate is greater than a pitch of any adjacent two of the plurality of third hybrid bonding structures bonding the wafer to the at least one chip.

6. The chip packaging structure according to claim 5, wherein each of the plurality of connection pins comprises a metal bump and/or a metal solder ball.

7. The chip packaging structure according to claim 5, wherein each of the at least one chip corresponds to two of the plurality of first hybrid bonding structures and two of the plurality of third hybrid bonding structures, and an orthographic projection of each of the two first hybrid bonding structures and the two third hybrid bonding structures on the packaging substrate is within an orthographic projection of the chip on the packaging substrate.

8. The chip packaging structure according to claim 5, wherein the wafer comprises a first semiconductor substrate, and a first dielectric layer and a second dielectric layer laminated on opposite sides of the first semiconductor substrate; a side surface of the second dielectric layer away from the first semiconductor substrate is taken as a pin surface.

9. The chip packaging structure according to claim 8, wherein at least one electronic device and at least one connecting metal column are formed in the first semiconductor substrate, and each of the at least one connecting metal column extends to a side surface of the first semiconductor substrate away from the first dielectric layer; the first hybrid bonding structure is formed in the second dielectric layer, electrically connected to the connecting metal column, and exposed from the pin surface.

10. The chip packaging structure according to claim 9, wherein at least one first interconnection structure is formed in the first dielectric layer, and each first interconnection structure is electrically connected to each connecting metal column in one-to-one correspondence; the third hybrid bonding structure comprises at least one third hybrid bonding structure, and each of the at least one third hybrid bonding structure is formed on a side surface of the first dielectric layer away from the first semiconductor substrate and is electrically connected to each first interconnection structure in one-to-one correspondence.

11. The chip packaging structure according to claim 10, wherein each chip comprises a second semiconductor substrate and a third dielectric layer; at least one electronic device is formed in the second semiconductor substrate, the third dielectric layer is laminated on the second semiconductor substrate and is attached to the first dielectric layer, and the third dielectric layer is formed with a second interconnection structure and a plurality of fourth hybrid bonding structures electrically connected to the second interconnection structure; the plurality of fourth hybrid bonding structures are formed on a side surface of the third dielectric layer away from the second semiconductor substrate; the plurality of fourth hybrid bonding structures are bonded to the plurality of third hybrid bonding structures for aligning and bonding the first dielectric layer with the third dielectric layer, and aligning and bonding the plurality of third hybrid bonding structures with the plurality of fourth hybrid bonding structures, to enable the chip to be bonded to the wafer.

12. The chip packaging structure according to claim 5, wherein the encapsulated grain further comprises an encapsulated layer, covering the at least one chip and a gap between adjacent two of the at least one chip.

13. The chip packaging structure according to claim 5, wherein the packaging substrate further comprises a third substrate and a fourth dielectric layer that are laminated; the third substrate comprises a first side and a second side opposite to each other; the second hybrid bonding structure is disposed on the first side of the third substrate, the connection pin is formed on the second side of the third substrate, and the metal post runs through the first side and second side of the third substrate.

14. The chip packaging structure according to claim 13, wherein the fourth dielectric layer is laminated to the first side of the third substrate and a side of the fourth dielectric layer away from the third substrate is taken as a substrate surface; the first hybrid bonding structure is arranged in the fourth dielectric layer, and the first hybrid bonding structure is connected to the second hybrid bonding structure and exposed from the substrate surface of the fourth dielectric layer.

15. The chip packaging structure according to claim 13, wherein the packaging substrate further comprises a fifth dielectric layer laminated on the second side of the third substrate; a metal connection block is formed in the fifth dielectric layer, arranged facing the metal post, and electrically connected to the metal post.

16. The chip packaging structure according to claim 15, wherein the connection pin is connected to a side surface of the metal connection block away from the metal post, to be indirectly electrically connected to the metal post through the metal connection block.

17. The chip packaging structure according to claim 5, further comprising a printed circuit board; wherein the connecting pin of the packaging substrate is bonded to a metal bump and/or a metal solder ball of the printed circuit board.

* * * * *